(12) United States Patent
Hsiao et al.

(10) Patent No.: US 12,300,640 B2
(45) Date of Patent: May 13, 2025

(54) SEMICONDUCTOR DEVICE AND METHOD OF MANUFACTURING THEREOF

(71) Applicant: TAIWAN SEMICONDUCTOR MANUFACTURING COMPANY, LTD., Hsinchu (TW)

(72) Inventors: Tsung-Chieh Hsiao, Shetou Township (TW); Hsiang-Ku Shen, Hsinchu (TW); Yuan-Yang Hsiao, Taipei (TW); Ying-Yao Lai, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/213,759

(22) Filed: Jun. 23, 2023

(65) Prior Publication Data
US 2023/0335517 A1    Oct. 19, 2023

Related U.S. Application Data

(62) Division of application No. 17/367,896, filed on Jul. 6, 2021, now Pat. No. 11,728,295.

(Continued)

(51) Int. Cl.
*H01L 23/00* (2006.01)

(52) U.S. Cl.
CPC .............. *H01L 24/03* (2013.01); *H01L 24/05* (2013.01); *H01L 24/13* (2013.01); *H01L 2224/02311* (2013.01); *H01L 2224/02313* (2013.01); *H01L 2224/02331* (2013.01); *H01L 2224/0239* (2013.01); *H01L 2224/0401* (2013.01);

(Continued)

(58) Field of Classification Search
CPC ... H01L 2224/0239; H01L 2224/02331; H01L 2924/01027
See application file for complete search history.

(56) References Cited

U.S. PATENT DOCUMENTS 10,957,738 B2    3/2021  Hashemi et al.
2004/0058526 A1*   3/2004  Cowley ............. H01L 21/76814
                                                          438/680
2013/0277842 A1*  10/2013  Baumann .......... H01L 23/53238
                                                          257/E23.161

OTHER PUBLICATIONS

Paul Besser, Ph.D., "BEOL Interconnect Innovations for Improving Performance," NCCAVS Symposium in San Jose, CA (Feb. 2017).
(Continued)

*Primary Examiner* — Dale E Page
*Assistant Examiner* — Wilner Jean Baptiste
(74) *Attorney, Agent, or Firm* — STUDEBAKER BRACKETT PLLC

(57) ABSTRACT

In a method of manufacturing a semiconductor device, an opening is formed in a first dielectric layer so that a part of a lower conductive layer is exposed at a bottom of the opening, one or more liner conductive layers are formed over the part of the lower conductive layer, an inner sidewall of the opening and an upper surface of the first dielectric layer, a main conductive layer is formed over the one or more liner conductive layers, a patterned conductive layer is formed by patterning the main conductive layer and the one or more liner conductive layers, and a cover conductive layer is formed over the patterned conductive layer. The main conductive layer which is patterned is wrapped around by the cover conductive layer and one of the one or more liner conductive layers.

20 Claims, 20 Drawing Sheets

Related U.S. Application Data

(60) Provisional application No. 63/166,892, filed on Mar. 26, 2021.

(52) U.S. Cl.
CPC ............... *H01L 2224/13144* (2013.01); *H01L 2224/13147* (2013.01); *H01L 2924/01027* (2013.01); *H01L 2924/01029* (2013.01)

(56) References Cited

OTHER PUBLICATIONS

Kevin Boyd, "Interconnect Tutorial: A Complex, Important Integration Evolution to sub-14nm Technology Nodes," SPCC Technical Program (Apr. 2018).
Seung Wook Ryu et al., "Area-selective chemical vapor deposition of Co for Cu capping layer," Current Applied Physics, vol. 16, pp. 88-92 (2016).
Notice of Allowance issued in U.S. Appl. No. 17/367,896, dated Mar. 23, 2023.
Non-Final Office Action issued in U.S. Appl. No. 17/367,896, dated Sep. 30, 2022.

\* cited by examiner

SEMICONDUCTOR DEVICE AND METHOD OF MANUFACTURING THEREOF

RELATED APPLICATIONS

This application is a division of U.S. patent application Ser. No. 17/367,896 filed Jul. 6, 2021, which claims priority to U.S. Provisional Patent Application No. 63/166,892 filed Mar. 26, 2021, the entire contents of each of which are incorporated herein by reference.

BACKGROUND

As consumer devices with ever better performance have gotten smaller and smaller in response to consumer demand, the individual components of these devices have necessarily decreased in size as well. Semiconductor devices, which make up major components of consumer devices such as mobile phones, computer tablets, and the like, have become smaller and smaller. The decrease in size of semiconductor devices has been met with advancements in semiconductor manufacturing techniques, such as forming redistribution layer (RDL) structures over a semiconductor circuit, die and/or chip, which electrically connect active devices in a semiconductor device (package).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

A redistribution layer (RDL) structure is used to reroute connections to electrodes (e.g., bump electrodes) to desired locations over a semiconductor device. For example, a bump array located in the center of a chip can be redistributed to positions near the chip edge by RDL structures. The ability to redistribute points can enable higher contact density and enable subsequent packaging steps. The RDL structure requires an additional process of forming one or more sets of a dielectric layer and a conductive (e.g., metal) layer over the original pad electrodes of a semiconductor device. The RDL layer is made of a conductive material, such as Cu or a Cu alloy. Reliability against, for example, stress migration of the RDL structure is one of the key issues of the semiconductor device and package technologies.

FIGS. 1-14 show various views a sequential manufacturing operation of a redistribution layer (RDL) structure over a semiconductor circuit according to an embodiment of the present disclosure. It is understood that additional operations can be provided before, during, and after processes shown by FIGS. 1-14, and some of the operations described below can be replaced or eliminated, for additional embodiments of the method. The order of the operations/processes may be interchangeable.

Figure 1:
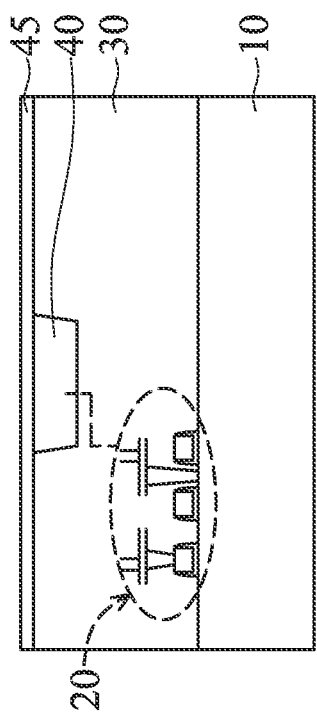
FIGS. 1, 2, 3, 4, 5, 6, 7, 8, 9, 10, 11 and 12 show cross sectional views of the various stages of a sequential manufacturing operation of a semiconductor device according to an embodiment of the present disclosure.

As shown in FIG. 1, a semiconductor circuit 20 is formed on or over a semiconductor substrate 10, and one or more pad electrodes 40 is formed over the substrate 10 and electrically connected to the semiconductor circuit.

The pad electrode 40 is formed of a suitable conductive metal, including aluminum, copper, silver, gold, nickel, tungsten, titanium, alloys thereof, and/or multilayers thereof. The pad electrode 40 is formed by a suitable metal deposition operation, including electro or electroless plating, physical vapor deposition (PVD) including sputtering, chemical vapor deposition (CVD), atomic layer deposition (ALD), thermal evaporation, or electron beam evaporation. A plurality of pad electrodes 40 are arranged in a row-column arrangement in some embodiments.

In some embodiments, the semiconductor circuit 20 includes transistors (e.g., field effect transistors (FETs)), capacitors, inductors, resistors, or the like. The pad electrodes 40 are electrically coupled to the semiconductor circuit 20 through underlying interconnection layers including wiring layers and vias (not shown) formed in dielectric layers 30, such as an interlayer dielectric (ILD) layer or an intermetal dielectric (IMD) layer in some embodiments. The wiring layers and vias of the interconnection layer may be formed of copper or copper alloys (e.g., AlCu), aluminum, tungsten, nickel, or any other suitable metal. The wiring layers and vias may be formed using damascene processes.

In some embodiments, the pad electrodes 40 have a width ranging from about 10 μm to about 500 μm as seen in plan view. In other embodiments, the pad electrodes 40 have a width ranging from about 20 μm to about 100 μm. In some embodiments, the plurality of pad electrodes 40 are arranged in a row-column arrangement having a pitch of about 20 μm to about 100 μm. In some embodiments, the pitch along the X direction is the same as or different from the pitch along the Y direction.

In some embodiments, bump structures (bump electrodes) are formed directly on the pad electrodes 40 or are connected to the bump electrode by one or more RDL structures.

In some embodiments, the substrate 10 is formed of at least one selected from the group consisting of silicon, diamond, germanium, SiGe, SiGeSn, SiGeC, GeSn, SiSn, GaAs, InGaAs, InAs, InP, InSb, GaAsP, GaInP, and SiC. In some embodiments, the semiconductor substrate 10 is a silicon wafer or substrate.

Figure 2:
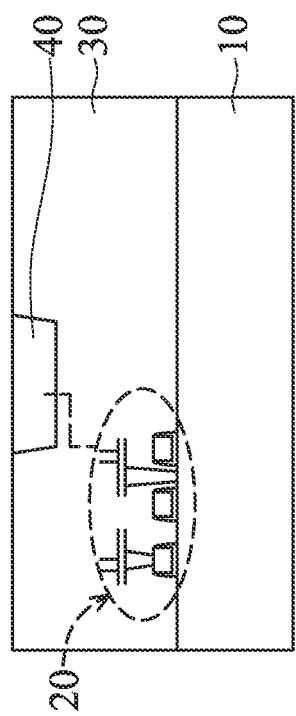

In some embodiments, a first passivation layer 45 is formed over the pad electrodes 40 and the dielectric layer 30 as shown in FIG. 2. In some embodiments, the first passivation layer 45 includes one or more layers of silicon oxide, silicon nitride, SiON, SiC, SiOCN, SiCN or any other suitable insulating layers. In certain embodiments, the first passivation layer 45 is made of silicon nitride.

Figure 3:
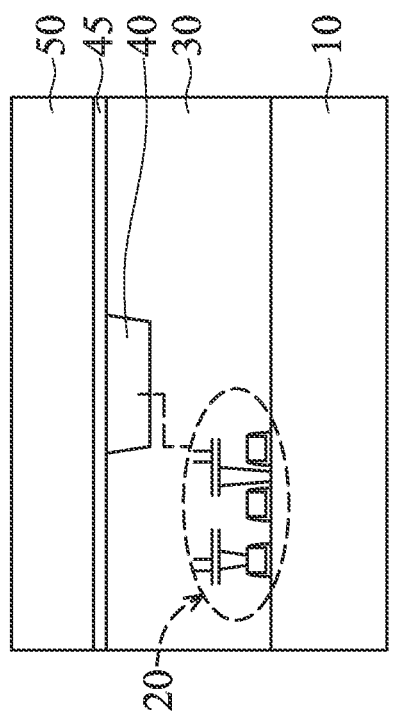

Further, in some embodiments, a second passivation layer 50 is formed over the first passivation layer 45 as shown in FIG. 3. In some embodiments, the second passivation layer 50 is made of a different material than the first passivation layer 45 and includes one or more layers of silicon oxide, silicon nitride, SiON, SiC, SiOCN, SiCN or any other suitable insulating layers. In certain embodiments, the second passivation layer 50 is made of silicon oxide. In some embodiments, the thickness of the second passivation layer 50 is greater than the thickness of the first passivation layer.

Figure 4:
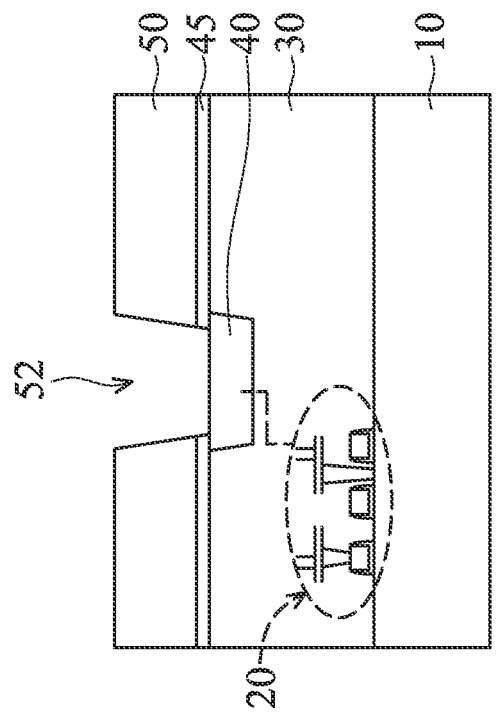

Then, the first and second passivation layers 45, 50 are patterned using suitable photolithography and etching operations to form an opening 52, in which part of the pad electrode 40 is exposed, as shown in FIG. 4. In some embodiments, the opening 52 has a tapered shape as shown in FIG. 4.

Figure 5:
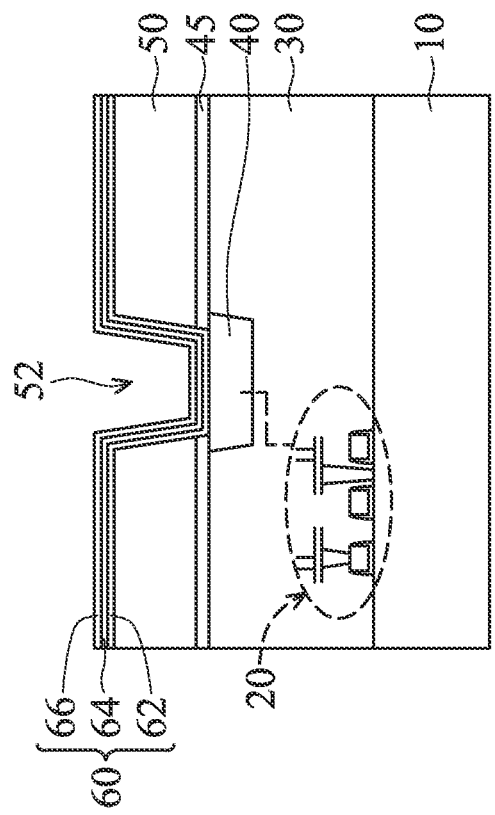

Then, as shown in FIG. 5, one or more underlying conductive layers 60 are formed over the exposed pad electrode 40, the inner wall of second passivation layer 50 in the opening 52 and the upper surface of the second passivation layer 50. In some embodiments, the underlying conductive layers 60 includes a first layer 62, a second layer 64 and a third layer 66.

In some embodiments, the first layer 62 is a liner, barrier and/or adhesion layer, and includes one or more of TaN, Ta, Cr, TiN, Ti or TiW. In certain embodiments, TaN is used. In some embodiments, the thickness of the first layer 62 is in a range from about 10 nm to about 30 nm depending on device and/or process requirements. In some embodiments, the first layer 62 is formed by a suitable metal deposition operation, including physical vapor deposition (PVD) including sputtering, chemical vapor deposition (CVD), atomic layer deposition (ALD), thermal evaporation, and electron beam evaporation.

In some embodiments, the second layer 64 is a liner layer, and is made of Co. In some embodiments, the purity of the Co layer 64 is more than 98%. In some embodiments, the Co layer 64 includes one or more impurities such as C and thus the purity of the Co layer is less than 100%. In some embodiments, the thickness of the second layer 64 is in a range from about 10 nm to about 30 nm. When the thickness of the second Co layer 64 is out of the range, stress migration improvement may not be obtained. In some embodiments, the second Co layer 64 is formed by a suitable metal deposition operation, including PVD, CVD, thermal evaporation, and electron beam evaporation.

In some embodiments, the third layer 66 is a seed layer, and includes one or more of Cu or a Cu alloy. A copper alloy contains 50 mol % or greater copper in some embodiments. In certain embodiments, Cu is used. In some embodiments, the thickness of the third layer 66 is in a range from about 30 nm to about 60 nm depending on device and/or process requirements. In some embodiments, the third layer 66 is formed by a suitable metal deposition operation, including PVD, CVD, ALD, thermal evaporation, and electron beam evaporation.

Figure 6:
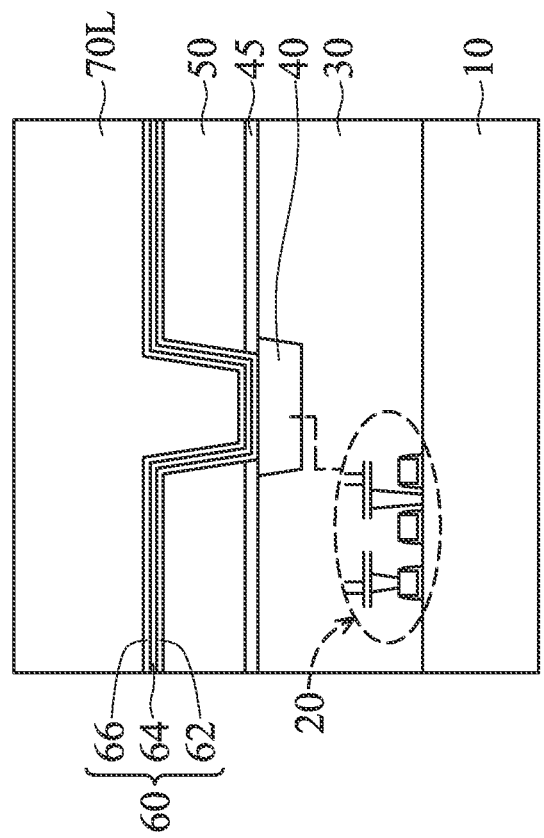

Next, as shown in FIG. 6, one or more conductive layers 70L for an RDL structure are formed over the underlying conductive layer 60. In some embodiments, the conductive layer 70L is a single layer of copper or a copper alloy. In other embodiments, the conductive layer 70L includes multiple layers. The conductive layer 70L may be formed by an electroplating process. In other embodiments, PVD including sputtering, CVD, ALD, thermal evaporation, and/or electron beam evaporation are employed to form the conductive layer 70L. The conductive layer 70L has a thickness in a range from about 100 nm to about 1 μm in some embodiments depending on design and/or process requirements.

Figure 7:
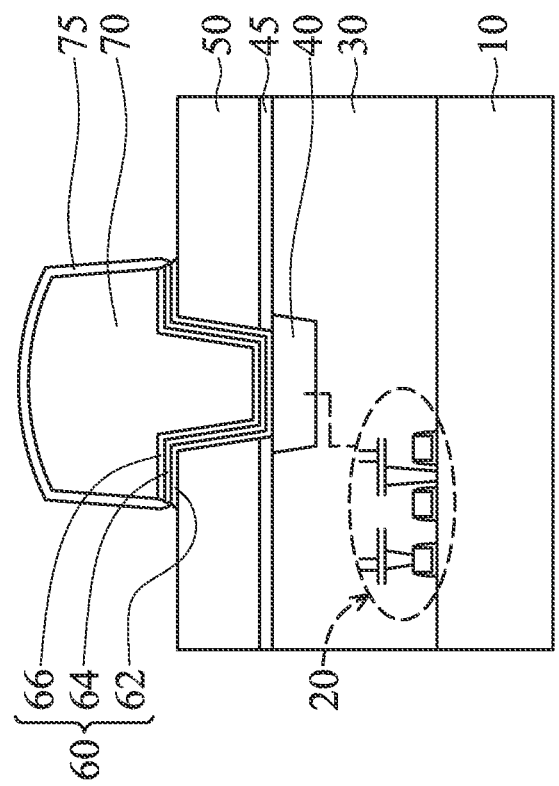

Then, the conductive layer 70L and the underlying conductive layers 62, 64 and 66 are patterned by one or more lithography and etching operations. In some embodiments, a photoresist layer is formed over the conductive layer 70L, and the photo resist layer is selectively exposed to actinic radiation. In some embodiments, the actinic radiation is ultraviolet radiation including i-line and g-line radiation, deep ultraviolet radiation, and extreme ultraviolet radiation, or an electron beam. In some embodiments, the actinic radiation is generated by a mercury arc lamp, or a laser, including ArF and KrF excimer lasers. The exposed photoresist layer is subsequently developed to form an RDL pattern. Then, as shown in FIG. 7, the conductive layer 70L and the first to third underlying conductive layers 62, 64 and 66 are patterned by using the photoresist layer 40 as an etching mask, thereby forming an RDL structure including a redistribution pattern 70. The etching includes one or more of dry etching and wet etching. Subsequently, the photo resist layer is removed.

Figure 8:
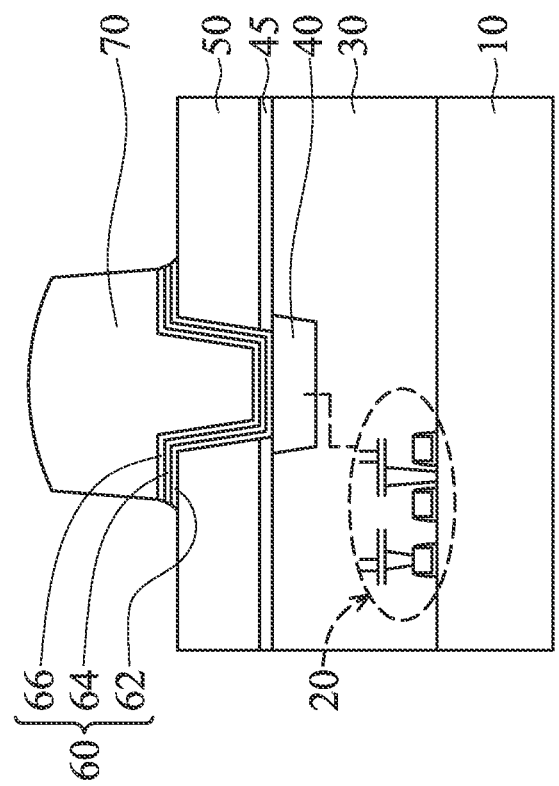

Then, as shown in FIG. 8, a cover layer 75 is selectively formed on the redistribution pattern 70. In some embodiments, the cover layer 75 is made of the same material as the second Co layer 64. Since the edge of the second layer 64 is exposed when the RDL structure is patterned as shown in FIG. 7, the cover layer 75 is connected to the second layer 64 and thus the combination of the cover layer 75 and the second layer 64 fully wraps around the redistribution pattern 70. In other words, the Cu layer 70 is sealed by the Co layer 64, 75. Thus, the redistribution pattern 70 is not in contact with the passivation layers.

In some embodiments, the cover layer 75 made of Co is formed by a selective CVD method using a cyclopentadienylcobalt dicarbonyl ($CoCp(CO)_2$) as a source gas. In some embodiments, the substrate is heated at a temperature in a range from about 200° C. to about 300° C. The Co layer 75 is formed substantially only on the conductive surfaces, such as the surface of RDL (Cu) 70, and the first to third conductive layers. In some embodiments, the thickness of the cover layer 75 is in a range from about 10 nm to about 100 nm. When the thickness of the cover layer 75 is out of the range, stress migration improvement may not be obtained. For example, if the thickness is too small (thin), the stress migration improvement as explained below my not be obtained, and if the thickness is too large (thick), there may be a metal (e.g., Co) residue on the dielectric layers after the contact opening is formed. In some embodiments, at least one of the second layer 64 or the cover layer 75 are made of one of Co V. Ta, Ti, Mo, Ni, Y, Nb, Zr, Ru, Re, Rh, Pd or Ir. In some embodiments, the cover layer 75 is in contact with the first conductive layer 62 and in other embodiments, the cover layer 75 is not in contact with the first conductive layer 62.

Figure 9:
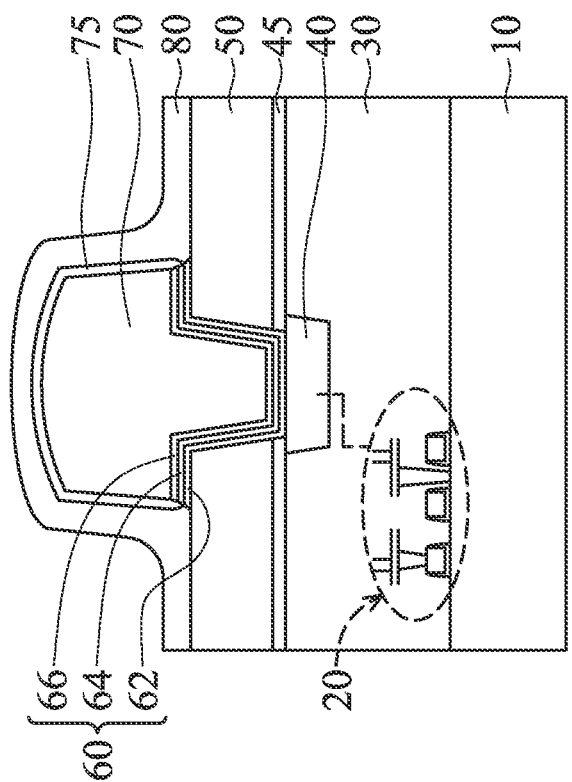

Then, one or more third passivation layers 80 are formed over the RDL structure and the upper surface of the second passivation layer 50, as shown in FIG. 9. In some embodiments, the third passivation layer 80 is made of a different material than the second passivation layer 50 and includes one or more layers of silicon oxide, silicon nitride, SiON, SiC, SiOCN, SiCN or any other suitable insulating layers. In certain embodiments, the third passivation layer 80 is made of silicon nitride. In some embodiments, the thickness of the second passivation layer 80 is greater than the thickness of the second passivation layer 50 and is in a range from about 500 nm to about 1000 nm.

Figure 10:
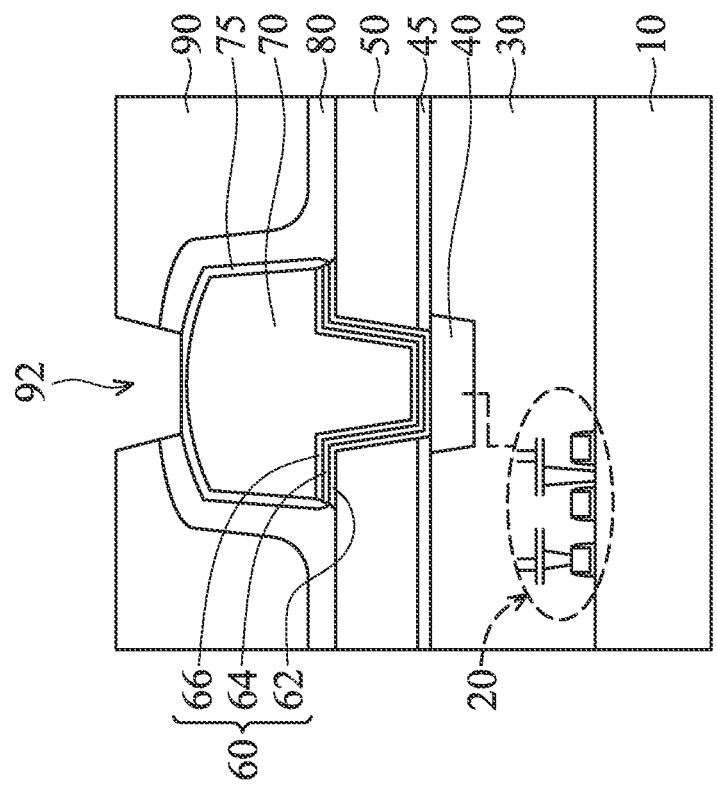

Further, one or more fourth passivation layers 90 are formed over the third passivation layer 80 and then openings 92 are formed over the RDL structure by using one or more patterning operations, as shown in FIG. 10. In some embodiments, the fourth passivation layer 90 is made of a different material than the third passivation layer 80 and includes an organic material, such as polyimide. In some embodiments, the thickness of the fourth passivation layer 90 is greater than the thickness of the third passivation layer 80 and is in a range from about 1 μm to about 100 μm. In some embodiments, the etching of the opening 92 stops on the cover layer 75 as shown in FIG. 10.

Subsequently, an under bump metallization (UBM) layer 100 is formed on the exposed over the exposed cover layer 75 and the inner sidewall of the fourth passivation layer 90 in the opening 92. In some embodiments, the UBM layer 100 includes an underlying conductive layer 102 and a seed layer 104 formed on the underlying conductive layer 102. In some embodiments, the underlying conductive layer 102 includes Ti, TiN or TiW, and the seed layer 104 includes copper or a copper alloy. A copper alloy contains 50 mol % or greater copper in some embodiments. In some embodiments, the UBM layers are formed by a suitable metal deposition operation, including physical vapor deposition (PVD) including sputtering, chemical vapor deposition (CVD), atomic layer deposition (ALD), thermal evaporation, and electron beam evaporation. In some embodiments, each of the underlying conductive layer 102 and the seed layer 104 has a thickness ranging from about 20 nm to about 100 nm.

Figure 12:
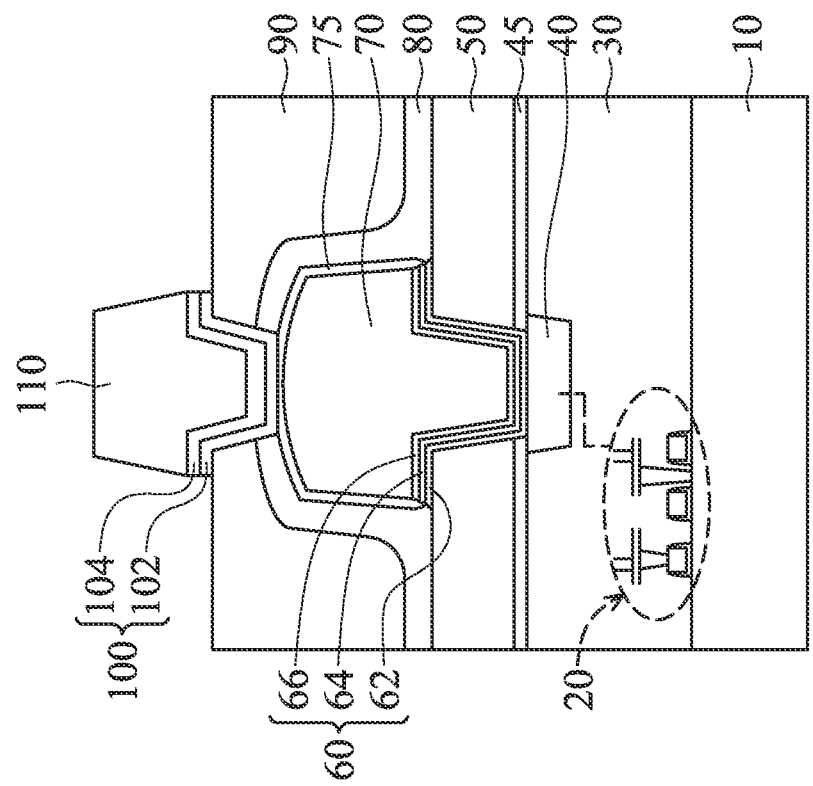

Next, as shown in FIG. 12, a bump electrode 110 is formed over the underlying conductive layer 100. In some embodiments, the bump electrode 110 is a single layer of copper, a copper alloy, gold or a gold alloy. In some embodiments, the bump electrode 110 includes multiple layers. In some embodiments, the bump electrode 110 is formed by an electroplating process and one or more patterning operations. In other embodiments, PVD including sputtering, CVD, ALD, thermal evaporation, and/or electron beam evaporation are employed. The bump electrode 110 has a thickness in a range from about 5 μm to about 10 μm in some embodiments.

In some embodiments, the bump electrode 110 is a multilayer structure including two or more layers of copper, gold, silver, aluminum, chromium, iron, manganese, magnesium, molybdenum, nickel, niobium, tantalum, titanium, tungsten, zinc, and alloys thereof, or a solder, such as AgSn. SnAgCu, PbSn, and CuSn.

Figure 14:
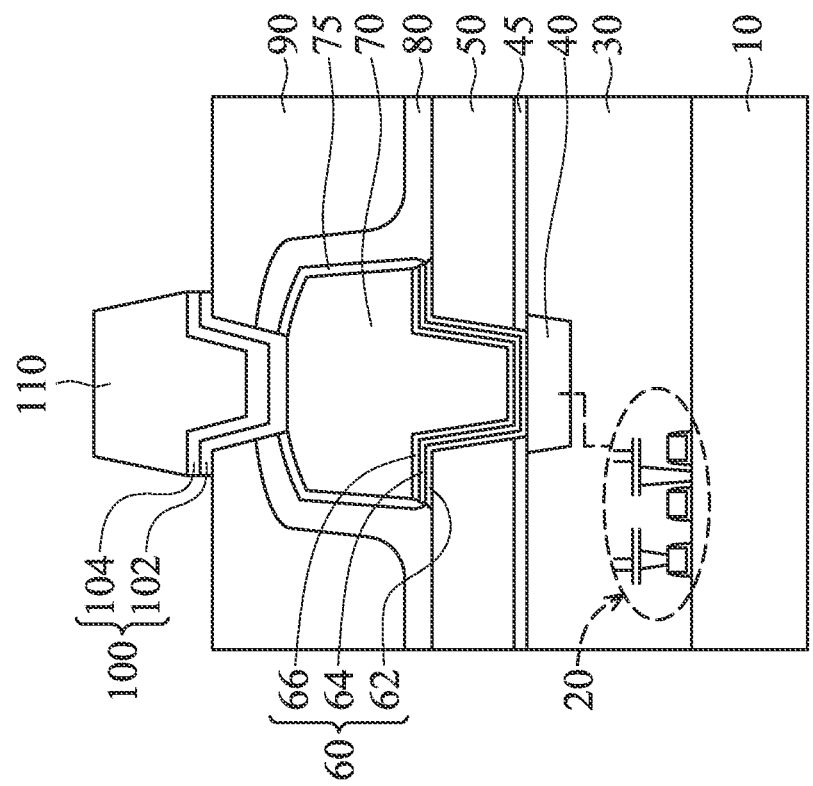
FIGS. 13 and 14 show cross sectional views of the various stages of a sequential manufacturing operation of a semiconductor device according to an embodiment of the present disclosure.
Figure 13:
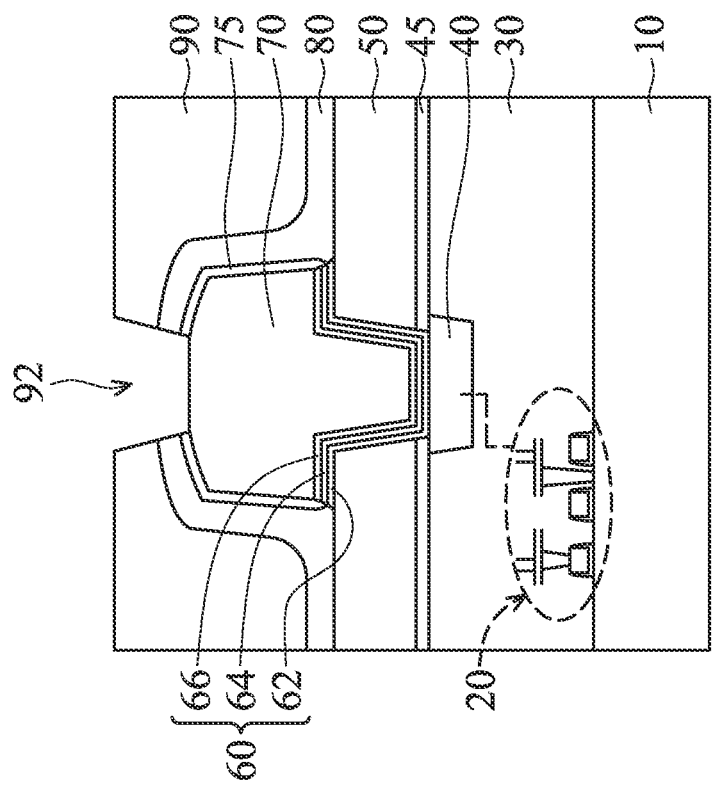

In some embodiments, as shown in FIGS. 13 and 14, the etching to form the opening 92 penetrates the cover layer 75 and stops on the redistribution pattern 70. In such a case, the redistribution pattern 70 is fully wrapped around by the combination of the second layer 64 and the cover layer 75 except for the contact portion to the bump electrode 110, and the redistribution pattern 70 is separated from and not in contact with the passivation layers.

As shown in FIGS. 12 and 14, the bump electrode 110 is formed above the original pad electrode 40.

FIGS. 15-21 show various views a sequential manufacturing operation of a redistribution layer (RDL) structure over a semiconductor circuit according to an embodiment of the present disclosure. It is understood that additional operations can be provided before, during, and after processes shown by FIGS. 15-21, and some of the operations described below can be replaced or eliminated, for additional embodiments of the method. The order of the operations/processes may be interchangeable. Materials, processes, methods, operations and/or configurations explained with respect to FIGS. 1-14 may be employed by the following embodiments, and the detailed description thereof may be omitted. In FIGS. 15-21, the substrate 10 and the semiconductor circuit 20 are omitted.

Figure 15:
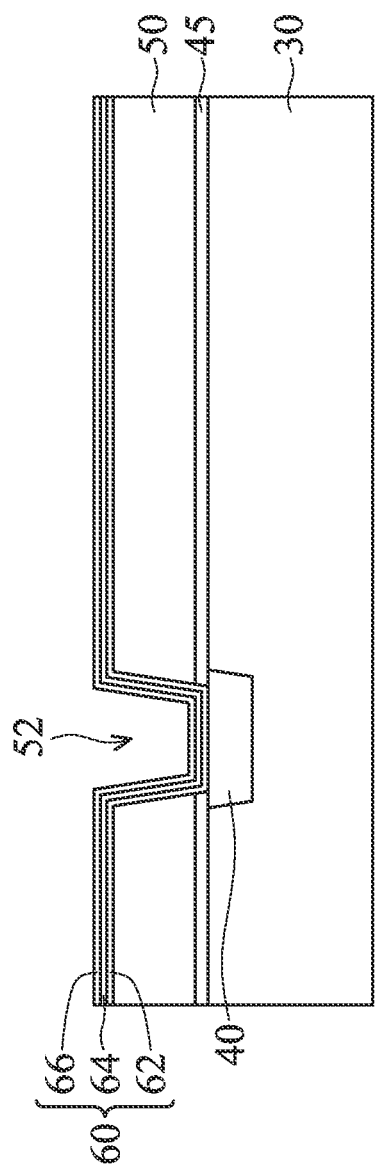
FIGS. 15, 16, 17, 18A, 18B, 19A, 19B, 20 and 21 show cross sectional views of the various stages of a sequential manufacturing operation of a semiconductor device according to an embodiment of the present disclosure.

Similar to FIG. 5, the underlying conductive layers 60 including the first layer 62, the second layer 64 and the third layer 66 are formed over the exposed pad electrode 40, the inner wall of second passivation layer 50 in the opening 52 and the upper surface of the second passivation layer 50 as shown in FIG. 15.

Figure 16:
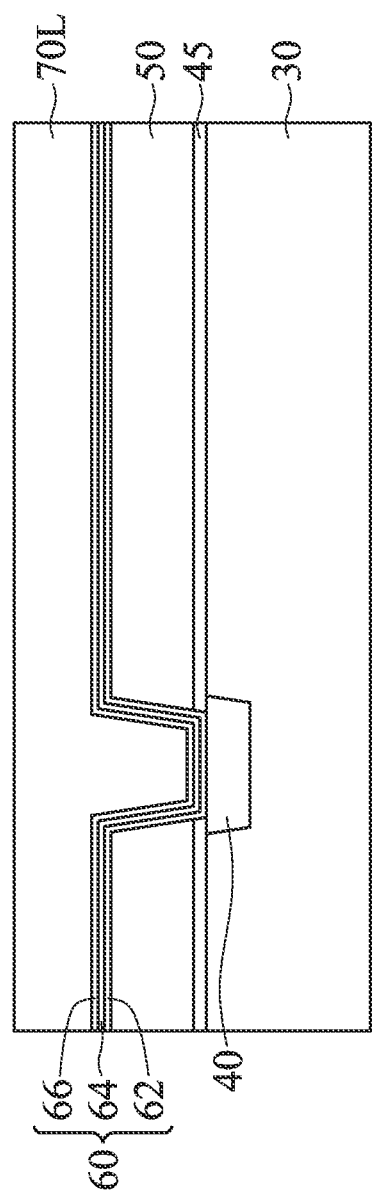

Then, similar to FIG. 6, the conductive layer 70L for an RDL structure is formed over the underlying conductive layer 60, as shown in FIG. 16.

Figure 17:
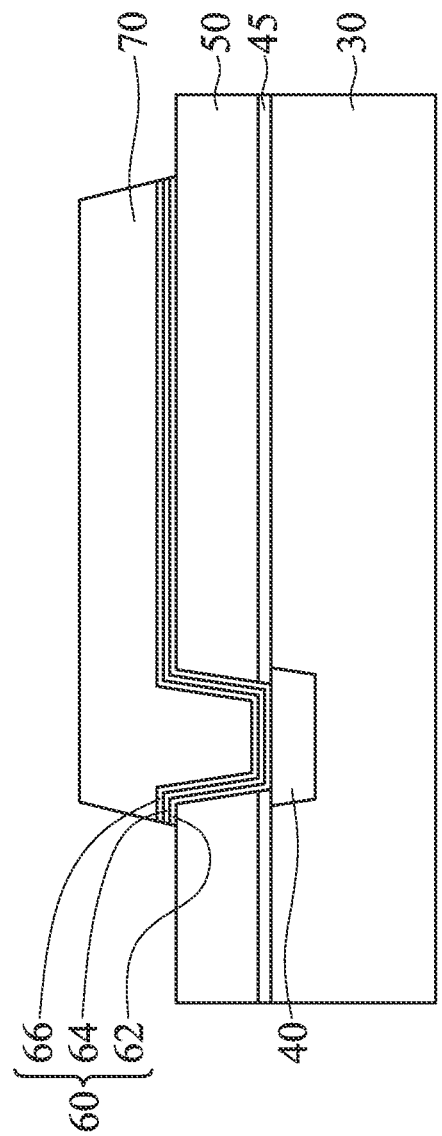

Then, similar to FIG. 7, the conductive layer 70L and the underlying conductive layers 62, 64 and 66 are patterned by one or more lithography and etching operations, as shown in FIG. 17. As shown in FIG. 17, the patterned RDL structure includes a laterally extended portion, which has a length more than the width of the pad electrode 40.

Figure 18A:
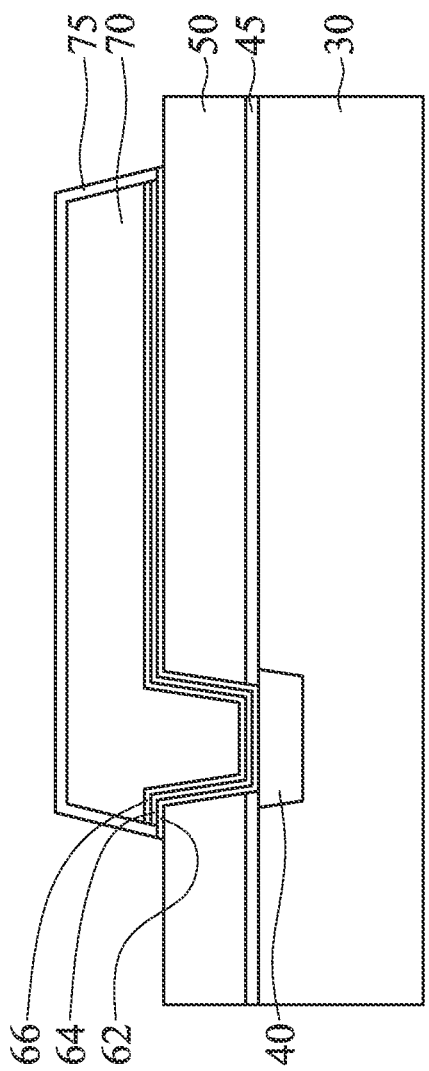
Figure 18B:
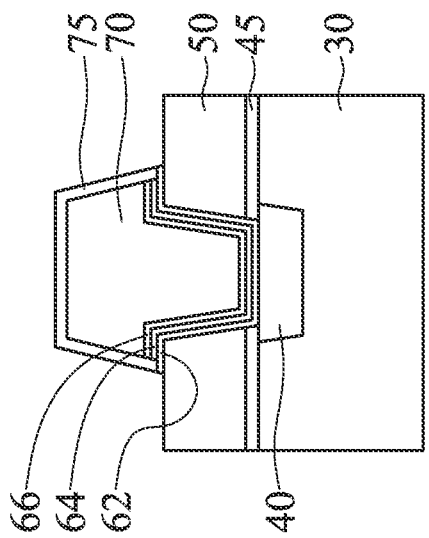

Similar to FIG. 8, a cover layer 75 is selectively formed on the redistribution pattern 70 as shown in FIGS. 18A and 18B. FIG. 18A is an X-Z cross section and FIG. 18B is a Y-Z cross section. In some embodiments, the cross section of the RDL structure shown in FIG. 18B is substantially symmetric with respect to the vertical axis passing the center of the pad electrode 40, and that shown in FIG. 18A is not symmetric. In some embodiments, the cover layer 75 is in contact with the first conductive layer 62 and in other embodiments, the cover layer 75 is not in contact with the first conductive layer 62.

Figure 19B:
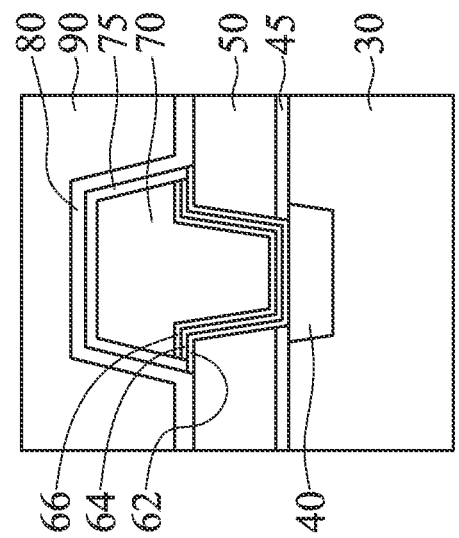
Figure 19A:
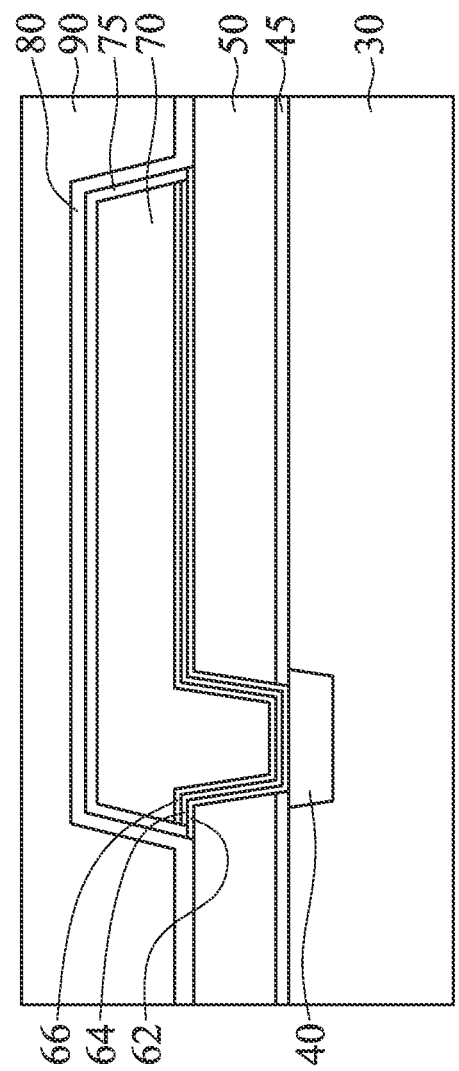
Figure 20:
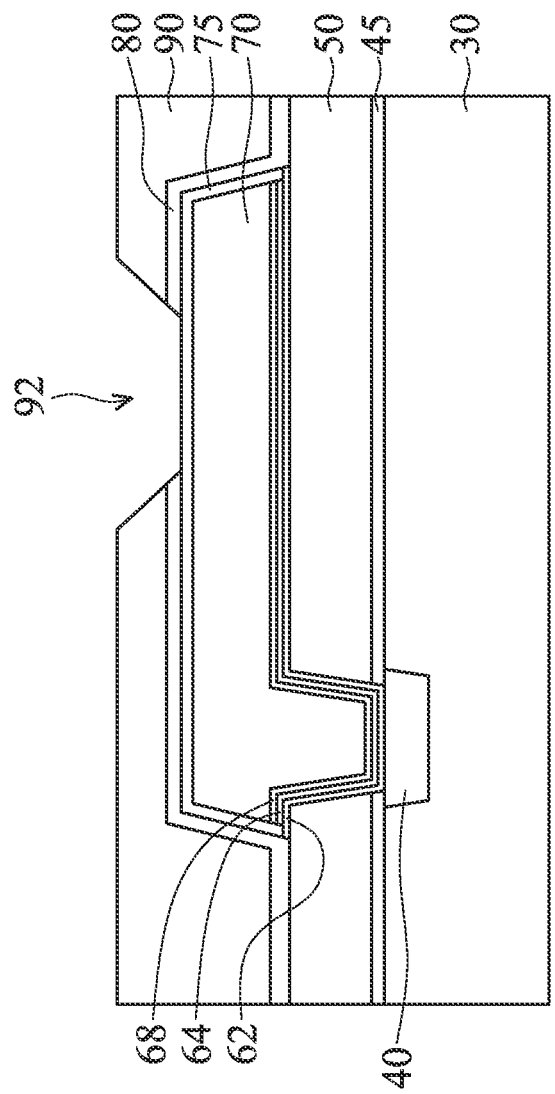

Further, similar to FIGS. 9 and 10, the third passivation layer 80 and the fourth passivation layer 90 are formed, as shown in FIGS. 19A and 19B. FIG. 19A is an X-Z cross section and FIG. 19B is a Y-Z cross section. Then, similar to FIG. 10, the opening 92 is formed to expose the cover layer 75 (or the redistribution pattern 70), as shown in FIG. 20.

Figure 11:
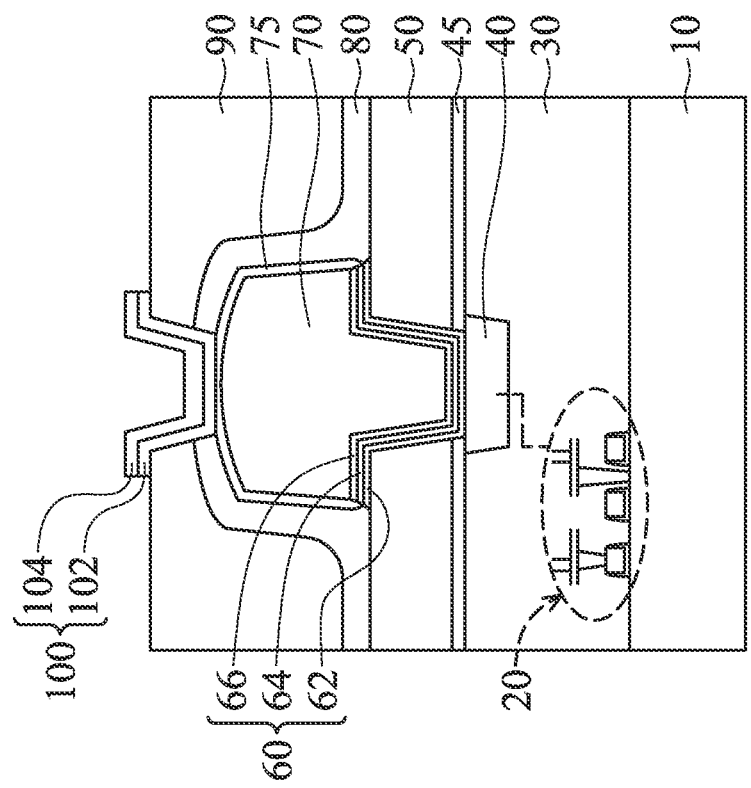
Figure 21:
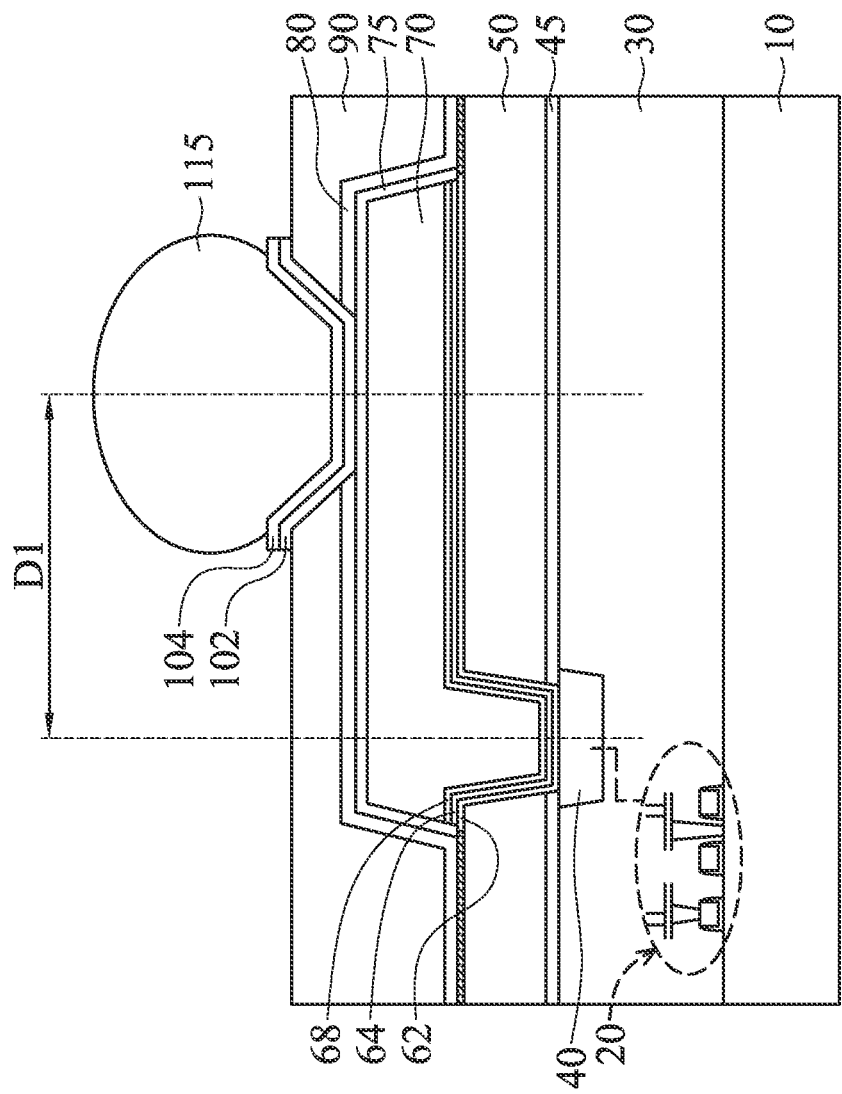

Subsequently, similar to FIGS. 11 and 12, the UBM layer 100 including the underlying layer 102 and the seed layer 104 are formed, and a bump electrode 115 is formed on the UBM layer 115, as shown in FIG. 21.

As shown in FIG. 21, the bump electrode 115 is connected to the original pad electrode 40 by the RDL structure including the Cu redistribution pattern 70 wrapped around by the Co layer. The RDL structure has a via portion passing through the dielectric layer 30 and connected to the pad electrode 40 and a wire portion disposed on an upper surface of the dielectric layer 30. The location of the pad electrode 115 is laterally offset from the original pad location by a distance D1 (center of the pad electrode 40 (or opening 52) to the center of the bump electrode 115 (or opening 92)). In some embodiments, the distance D1 is more than about 10 μm and is more than 100 μm in other embodiments. In some embodiments, the distance D1 is less than about 10 mm.

In some embodiments, the redistribution pattern 70 wrapped with a Co layer improves reliability of the RDL structure. In particular, this structure can improve stress and electro migration properties of the RDL structure by more than about 50% in terms of R tailing after baking. For example, when mechanical and/or electric stress is applied to Cu RDL layer, Cu atoms may migrate forming a void or opening, which causes high resistance or forming a Cu to Cu leakage path, which causes low resistance. The Co cover layer can suppress such stress and/or electro migration of Cu atoms. Further, the Co cover layer 75 can enhance or improve adhesion between the RDL structure (Co layer) and the passivation silicon nitride layer thereby preventing any slit, crack or void defect at the interface between the RDL structure and the passivation layer.

Figure 22:
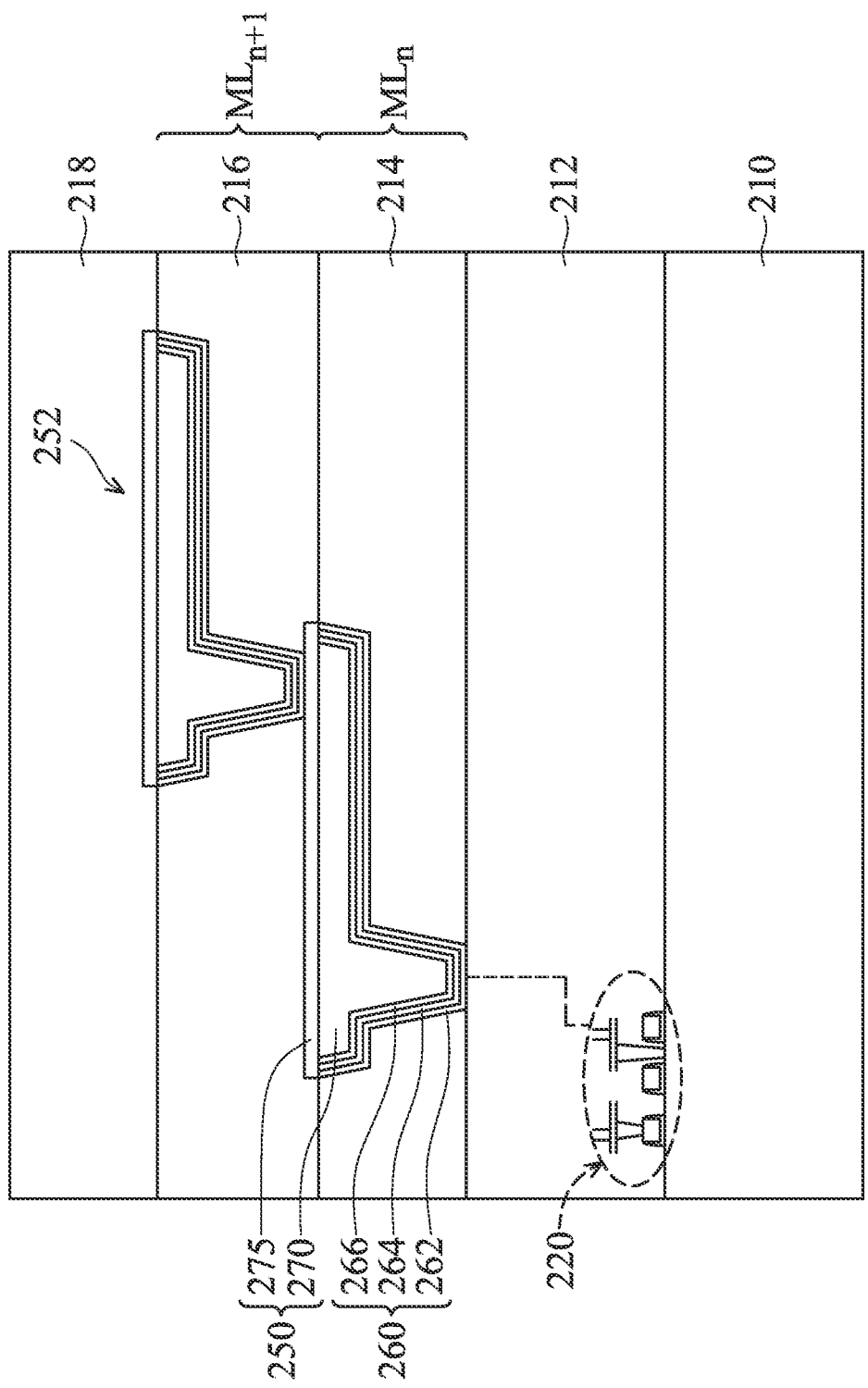
FIG. 22 shows a cross sectional view of a semiconductor device according to an embodiment of the present disclosure.

FIG. 22 shows a cross sectional view of a semiconductor device according to an embodiment of the present disclosure. Materials, processes, methods, operations and/or configurations explained with respect to FIGS. 1-21 may be employed by the following embodiments, and the detailed description thereof may be omitted.

The metal (e.g., Co) wrapped-around conductive (e.g., Cu) layer can be employed not only for the RDL structures but also for one or more metal wiring layers of back-end-of-line (BEOL) process. In some embodiments, the wrapping layer is a high melting temperature metal having a melting temperature higher than the wrapped layer. The wrapping layer includes Co, V, Ta, Ti, Mo, Ni, Y, Nb, Zr, Ru, Rc, Rh, Pd or Ir. The wrapped layer includes Cu, Al, or an alloy thereof.

As shown in FIG. 22, a semiconductor device includes a substrate 210, which is consistent with the substrate 10 as set forth above, on which a semiconductor circuit 220 is disposed, which is consistent with the semiconductor circuit 20 as set forth above. One or more interlayer or intermetal dielectric layers 212, 214, 216 and 218, which is the same as or similar to the dielectric layer 30 as set forth above, are disposed over the semiconductor circuit 220. One or more metal wiring layers including the n-th metal wiring layer ML) and (n+1)-th metal wiring layer $ML_{n+1}$ are disposed over the dielectric layer 212, where n is natural number up to about 20. Each metal wiring layer includes a dielectric layer, conductive wiring patterns and vias (contacts) to the lower metal layer in some embodiments. In some embodiments, the dielectric layers 212-218 are made of silicon oxide, SiOC, SiOCN, SiCN, organic material, or any other suitable dielectric material.

In some embodiments, a conductive pattern 250 in the n-th metal wiring layer $ML_n$ includes an underlying conductive layer 260 consistent with the underlying conductive layer 60, which includes a first layer 262, a second layer 264 and a third layer 266, which are the same as or similar to the first layer 62, the second layer 64 and the third layer 66, respectively. Further, the conductive pattern 250 includes a wiring layer 270 and a cover layer 275, which are the same as or similar to the redistribution pattern 70 and the cover layer 75.

In some embodiments, the first layer 262 is a liner, barrier and/or adhesion layer, and includes one or more of TaN, Ta, Cr, TiN, Ti or TiW. In certain embodiments, TaN is used. In some embodiments, the thickness of the first layer 262 is in a range from about 2 nm to about 10 nm depending on device and/or process requirements. In some embodiments, the first layer 262 is formed by a suitable metal deposition operation, including PVD, CVD, ALD, thermal evaporation, and electron beam evaporation.

In some embodiments, the second layer 264 is a liner layer, and includes metal, such as Co, V, Ta, Ti, Mo, Ni, Y, Nb, Zr, Ru, Re, Rh, Pd or Ir. In certain embodiments, Co is used. In some embodiments, the purity of the metal layer 264 is more than 98%. In some embodiments, the metal layer 264 includes one or more impurities, such as C and thus the purity of the metal layer is less than 100%. In some embodiments, the thickness of the second metal layer 264 is in a range from about 2 nm to about 10 nm. In some embodiments, the second metal layer 264 is formed by a suitable metal deposition operation, including PVD. CVD, thermal evaporation, and electron beam evaporation.

In some embodiments, the third layer 266 is a seed layer, and includes one or more of Cu or a Cu alloy, when the wrapped conductive layer is formed by electro plating. A copper alloy contains 50 mol % or greater copper in some embodiments. In certain embodiments, Cu is used. In some embodiments, the thickness of the third layer 266 is in a range from about 5 nm to about 20 nm depending on device and/or process requirements. In some embodiments, the third layer 266 is formed by a suitable metal deposition operation, including PVD, CVD, ALD, thermal evaporation, and electron beam evaporation. In some embodiments, when the wrapped conductive layer 270 is formed by PVD, CVD or ALD, no seed layer (no third layer) is used.

The wrapped conductive layer 270 includes Cu, Al, or an alloy thereof. In other embodiments, the wrapped conductive layer 270 includes W, Co, Mo Ta, Ti or an alloy thereof. The cover layer 275, which is the same as or similar to the cover layer 75, is made of a different material than the wrapped conductive layer 270 and includes a metal, such as Co, V, Ta, Ti, Mo, Ni, Y, Nb, Zr, Ru, Re, Rh, Pd or Ir. In some embodiments, the cover layer 275 is made of a material having a higher melting point than the wrapped conductive layer 270. In some embodiments, the cover layer 275 is made of the same metal as the second metal layer 264, and in other embodiments, the cover layer 275 is made of a different material than the second layer 264. In some embodiments, the thickness of the cover layer 275 is in a range from about 2 nm to about 10 nm. In some embodiments, the cover layer 275 is formed by a suitable metal deposition operation, including PVD, CVD, ALD, thermal evaporation, and electron beam evaporation. Since the combination of the second layer 264 and the cover layer 275 fully wraps around the conductive layer 270, the conductive layer 270 is fully separated from and is not in contact with the dielectric layers in some embodiments.

In some embodiments, another conductive pattern 252 is disposed over and coupled to the conductive pattern 250. In some embodiments, the via or contact portion of the conductive pattern 252 is disposed on the cover layer 275. In other embodiments, the via or contact portion of the conductive pattern 252 penetrates the cover layer 275 and contacts the conductive layer 270. The conductive layer 270 is still fully separated from and is not in contact with the dielectric layers.

FIGS. 23-28 show various views a sequential manufacturing operation of the semiconductor device shown in FIG. 22 according to an embodiment of the present disclosure. It is understood that additional operations can be provided before, during, and after processes shown by FIGS. 23-28, and some of the operations described below can be replaced or eliminated, for additional embodiments of the method. The order of the operations/processes may be interchangeable. Materials, processes, methods, operations and/or configurations explained with respect to FIGS. 1-21 may be employed to the following embodiments, and the detailed description thereof may be omitted. In FIGS. 23-28, the substrate 210 and the semiconductor circuit 220 are omitted. In some embodiments, a dual damascene technology is used in the manufacturing operation shown in FIGS. 23-28.

Figure 23:
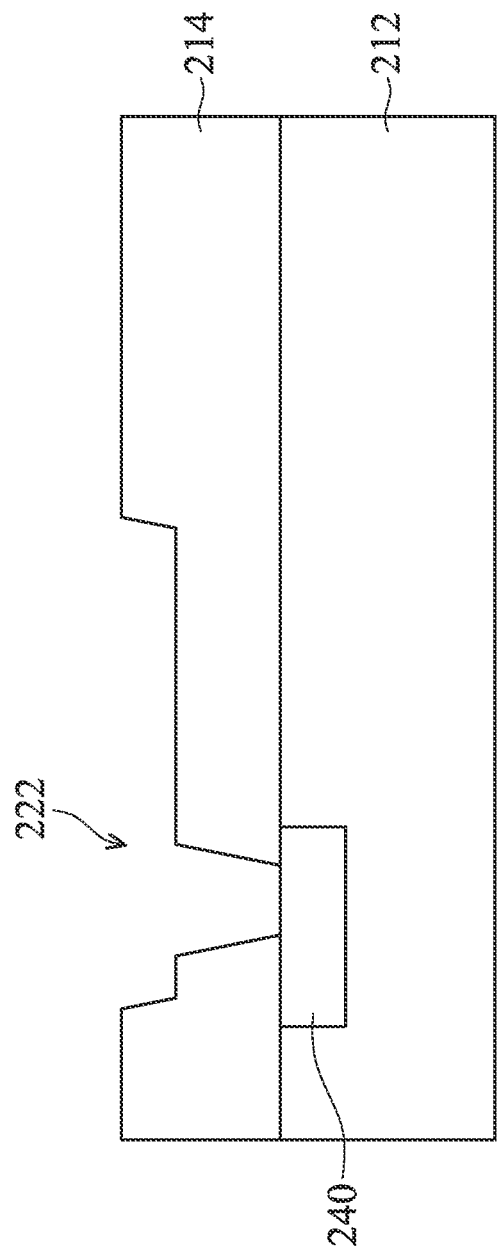
FIGS. 23, 24, 25, 26, 27 and 28 show cross sectional views of the various stages of a sequential manufacturing operation of a semiconductor device according to an embodiment of the present disclosure.

As shown in FIG. 23, by using one or more lithography and etching operations, a groove or trench pattern 222 having a shallow wire portion and a deep via portion is formed in the dielectric layer 214 disposed over the dielectric layer 212. In some embodiments, a lower conductive pattern 240 is formed in the dielectric layer 212, and a part of the upper surface of the conductive pattern 240 is exposed at the bottom of the deep via portion.

Figure 24:
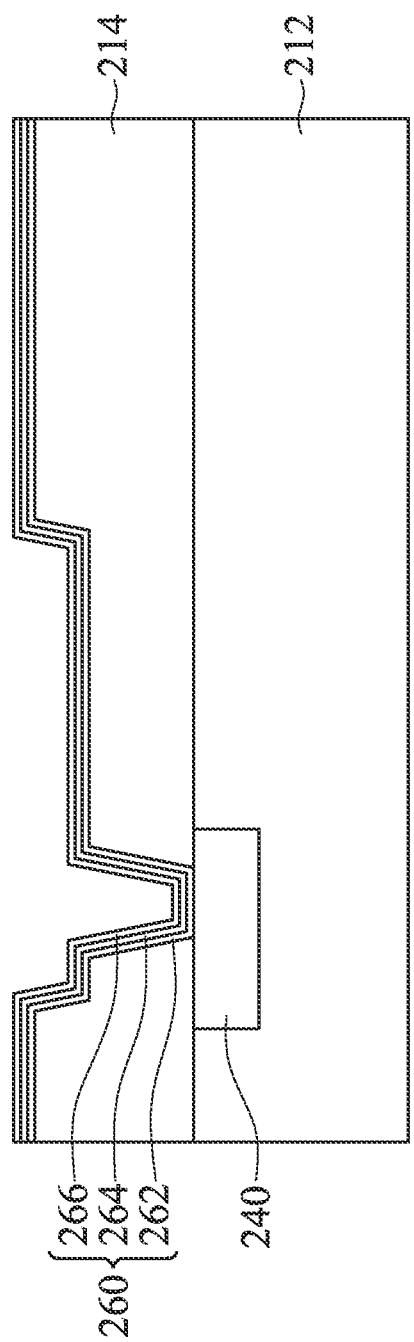

Then, the underlying conductive layers 260 including the first layer 262 (e.g., barrier layer), the second layer 264 and the third layer 266 (e.g., seed layer) are formed over the exposed conductive pattern 240, the inner wall of dielectric layer 214 in the trench 222 and the upper surface of the dielectric layer 214, as shown in FIG. 24.

Figure 25:
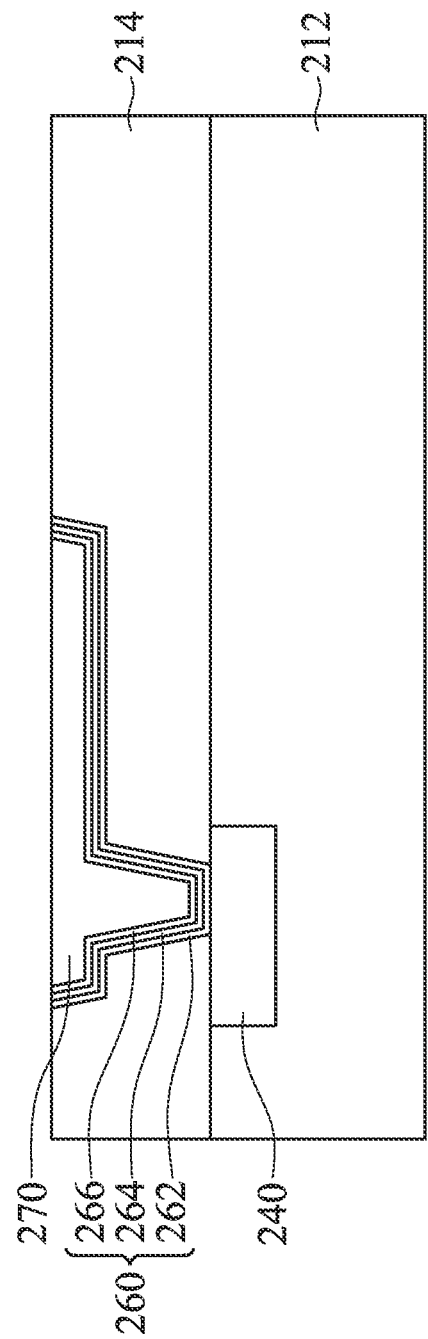

Then, the conductive material is formed in the trench 222 and over the upper surface of the dielectric layer 214 (on the underlying conductive layer 260), and a planarization operation, such as a chemical mechanical polishing (CMP) operation, is performed to remove excess materials on the upper surface of the dielectric layer 214, thereby forming the conductive layer 270, as shown in FIG. 25.

Figure 26:
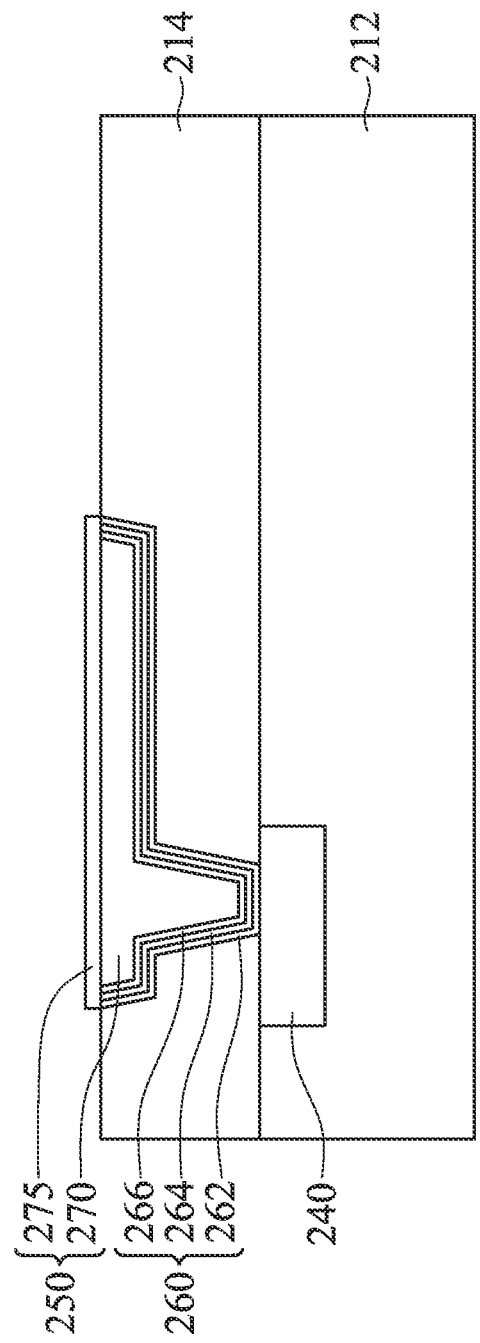

Next, a cover layer 275 is selectively formed on the conductive layer 270 and exposed portions of the underlying conductive layer 260, thereby forming the conductive pattern 250, as shown in FIG. 26. In some embodiments, after the selective formation of the cover layer 275, one or more cleaning operations including wet etching are performed to remove any material of the cover layer formed on the upper surface of the dielectric layer 214. Thus, cover layer 275 is not disposed on the upper surface of the dielectric layer 214. As set forth above, the conductive layer 270 is fully wrapped around or sealed by the cover layer 275 and the second layer 264.

Figure 27:
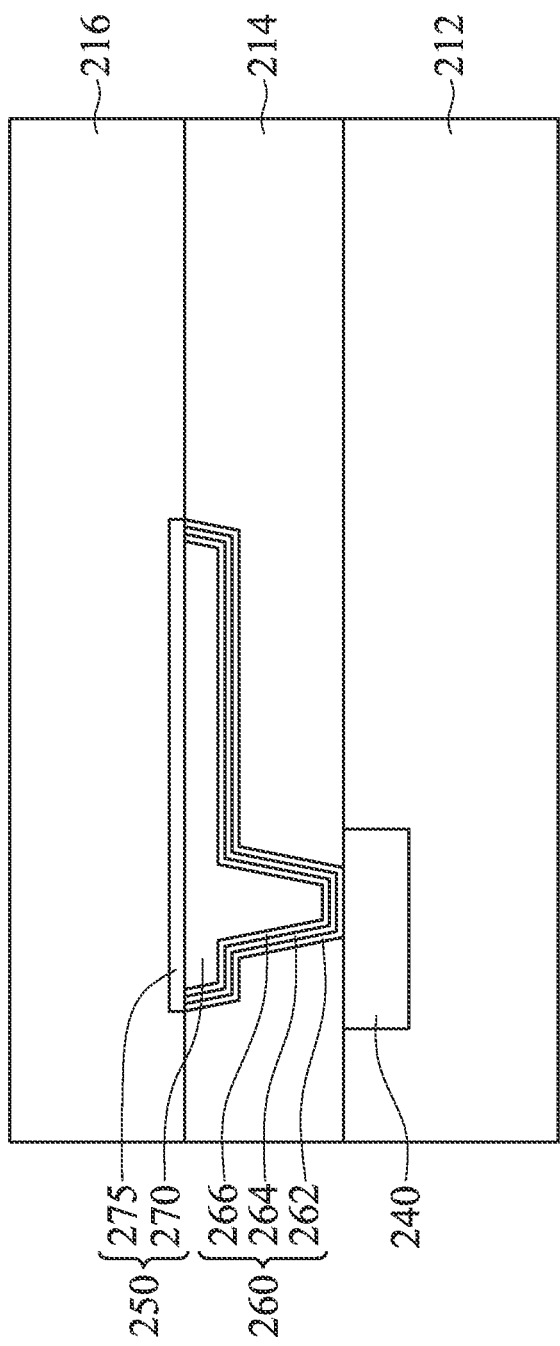

Subsequently, a dielectric layer 216 is formed over the conductive layer 270 with the cover layer 275 and the dielectric layer 214, as shown in FIG. 27.

Figure 28:
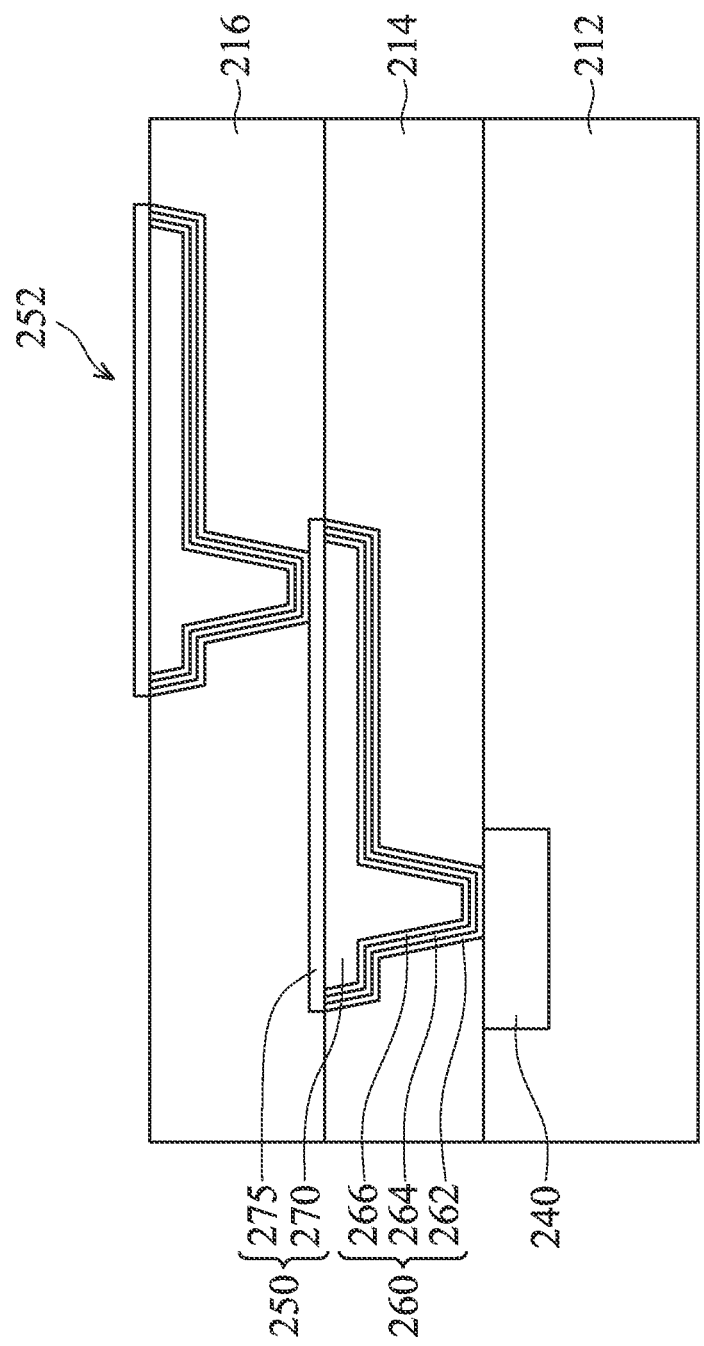

By repeating the operations explained with respect to FIGS. 23-26, another conductive pattern 252 is formed in the dielectric layer 216, as shown in FIG. 28.

In some embodiments, the conductive pattern 270 wrapped with another metal (e.g., Co) layer improves reliability of the metal wiring structure. In particular, this structure can improve stress and electro migration properties of the metal wiring structure.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, an opening is formed in a first dielectric layer so that a part of a lower conductive layer is exposed at a bottom of the opening, one or more liner conductive layers are formed over the part of the lower conductive layer, an inner sidewall of the opening and an upper surface of the first dielectric layer, a main conductive layer is formed over the one or more liner conductive layers, a patterned conductive layer is formed by patterning the main conductive layer and the one or more liner conductive layers, and a cover conductive layer is formed over the patterned conductive layer. The main conductive layer which is patterned is wrapped around by the cover conductive layer and one of the one or more liner conductive layers. In one or more of the foregoing or following embodiments, the one of the one or more liner conductive layers and the cover layer are made of a same metal material. In one or more of the foregoing or following embodiments, the same metal material is Co. In one or more of the foregoing or following embodiments, the patterned conductive layer and the cover layer constitute a redistribution layer. In one or more of the foregoing or following embodiments, when the one or more liner conductive layers are formed, a first liner conductive layer is formed on the part of the lower conductive layer, the inner sidewall of the opening and the upper surface of the first dielectric layer, a second liner conductive layer is formed over the first liner conductive layer, and a third liner conductive layer is over the second liner conductive layer. The cover conductive layer and the second liner conductive layer wrap around the main conductive layer which is patterned. In one or more of the foregoing or following embodiments, the first liner conductive layer includes one or more of TaN, Ta, Ti, TiN or TiW. In one or more of the foregoing or following embodiments, the second liner conductive layer includes Co. In one or more of the foregoing or following embodiments, the third liner conductive layer includes Cu or a Cu alloy. In one or more of the foregoing or following embodiments, the main conductive layer includes Cu or a Cu alloy formed by electro plating using the third conductive layer as a seed layer.

In accordance with another aspect of the present disclosure, in a method of manufacturing a semiconductor device, a first opening is formed in a first dielectric layer so that a part of a lower conductive layer is exposed at a bottom of the first opening, a first liner conductive layer is formed on the part of the lower conductive layer, an inner sidewall of the first opening and an upper surface of the first dielectric layer, a second liner conductive layer is formed over the first liner conductive layer, a third liner conductive layer is formed over the second liner conductive layer, a main conductive layer is formed over the third liner conductive layer, a patterned conductive layer is formed by patterning the main conductive layer and the first, second and third liner conductive layers, a redistribution layer is formed by forming a cover conductive layer over the patterned conductive layer, a second dielectric layer is formed over the redistribution layer, a second opening is formed in the second dielectric layer so that a part of the redistribution layer is exposed at a bottom of the second opening, and an electrode in the second opening to contact the redistribution layer. The main conductive layer which is patterned is fully separated from the second dielectric layer. In one or more of the foregoing or following embodiments, the cover layer and the second liner layer are made of a same material. In one or more of the foregoing or following embodiments, the main conductor is sealed by the cover conductive layer and the second liner conductive layer. In one or more of the foregoing or following embodiments, a part of the cover conductive layer is exposed at the bottom of the second opening, and is disposed between the electrode and the main conductive layer. In one or more of the foregoing or following embodiments, a part of the main conductive layer is exposed at the bottom of the second opening, and the electrode is in contact with the main conductive layer. In one or more of the foregoing or following embodiments, a center of the second opening is laterally shifted from a center of the first opening. In one or more of the foregoing or following embodiments, the second liner conductive layer is made of Co, and the main conductive layer is made of Cu or a Cu alloy.

In accordance with another aspect of the present disclosure, in a method of manufacturing a semiconductor device, a trench is formed in a first dielectric layer, the trench including a shallow wire portion and a deep via portion having a greater depth than the shallow wire portion, one or more liner conductive layers are formed in the trench and an upper surface of the first dielectric layer, a main conductive layer is formed over the one or more liner conductive layers, a patterned conductive layer embedded in the first dielectric layer is formed by performing a planarization operation, and a cover conductive layer is formed over the patterned conductive layer. The main conductive layer is fully wrapped around by the cover conductive layer and one of the one or more liner conductive layers. In one or more of the foregoing or following embodiments, the one of the one or more liner conductive layers and the cover layer are made of a same metal material. In one or more of the foregoing or following embodiments, the same metal material is one of Co, V, Ta, Ti, Mo, Ni, Y, Nb, Zr, Ru, Re, Rh, Pd or Ir. In one or more of the foregoing or following embodiments, the one of the one or more liner conductive layers and the cover layer are made of different materials from each other.

In accordance with another aspect of the present disclosure, a semiconductor device includes a redistribution layer including a first liner conductive layer, a main conductive layer disposed over the first liner conductive layer, and a cover conductive layer. The main conductive layer is fully wrapped around by the cover conductive layer and the first liner conductive layer. In one or more of the foregoing or following embodiments, the first liner conductive layer and the cover layer are made of a same metal material. In one or more of the foregoing or following embodiments, the same metal material is Co. In one or more of the foregoing or following embodiments, the semiconductor device further includes a second liner conductive layer below the first liner conductive layer, and a third liner conductive layer over the first liner conductive layer. The first, second and third liner conductive layers are made of different materials from each other. In one or more of the foregoing or following embodiments, the first liner conductive layer is mad of Co. In one or more of the foregoing or following embodiments, the second liner conductive layer includes one or more of TaN, Ta, Ti, TiN or TiW. In one or more of the foregoing or following embodiments, the third liner conductive layer includes Cu or a Cu alloy. In one or more of the foregoing or following embodiments, the main conductive layer includes Cu or a Cu alloy.

In accordance with another aspect of the present disclosure, a semiconductor device includes a pad electrode formed in or on a first dielectric layer, a second dielectric layer disposed over the first dielectric layer, a redistribution layer having a via portion passing through the second dielectric layer and connected to the pad electrode and a wire portion disposed on an upper surface of the second dielectric layer, a third dielectric layer disposed over the redistribution layer, and a bump electrode connected to the redistribution layer through an opening formed in the third dielectric layer. The redistribution layer includes a liner conductive layer, a main conductive layer disposed over the liner conductive layer, and a cover conductive layer, and the main conductive layer is fully sealed by the cover conductive layer and the liner conductive layer. In one or more of the foregoing or following embodiments, the main conductive layer is not in contact with the second dielectric layer and the third dielectric layer. In one or more of the foregoing or following embodiments, a part of the cover conductive layer is disposed between the bump electrode and the main conductive layer. In one or more of the foregoing or following embodiments, a part of the main conductive layer is in contact with the bump electrode. In one or more of the foregoing or following embodiments, a center of the pad electrode is laterally shifted from a center of the bump electrode. In one or more of the foregoing or following embodiments, the liner conductive layer and the cover conductive layer are made of Co, and the main conductive layer is made of Cu or a Cu alloy. In one or more of the foregoing or following embodiments, the semiconductor device further includes a barrier layer below the liner layer. In one or more of the foregoing or following embodiments, the barrier layer includes one or more of TaN, Ta, Ti, TiN or TiW.

In accordance with another aspect of the present disclosure, a semiconductor device includes a trench disposed in a first dielectric layer, the trench including a shallow wire portion and a deep via portion having a greater depth than the shallow wire portion, one or more liner conductive layers disposed in the trench, a main conductive layer disposed over the one or more liner conductive layers in the trench, a cover conductive layer disposed over the main conductive layer, and a second dielectric layer disposed over the cover layer and the first dielectric layer. The main conductive layer is fully wrapped around by the cover conductive layer and one of the one or more liner conductive layers. In one or more of the foregoing or following embodiments, the cover conductive layer is not disposed on an upper surface of the first dielectric layer. In one or more of the foregoing or following embodiments, the one of the one or more liner conductive layers and the cover layer are made of a same metal material, and the same metal material is one of Co, V, Ta, Ti, Mo, Ni, Y, Nb, Zr, Ru, Re, Rh, Pd or Ir. In one or more of the foregoing or following embodiments, the main conductive layer is not in contact with the first and second dielectric layers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
 a first dielectric layer;
 a redistribution layer formed in the first dielectric layer, including a first liner conductive layer, a main conduc- tive layer disposed over the first liner conductive layer, and a cover conductive layer; and a second dielectric layer disposed over the cover conductive layer and the first dielectric layer, wherein the main conductive layer is fully wrapped around by the cover conductive layer and the first liner conductive layer.

2. The semiconductor device of claim 1, wherein the first liner conductive layer and the cover layer are made of a same metal material.

3. The semiconductor device of claim 2, wherein the same metal material is Co.

4. The semiconductor device of claim 1, further comprising:
a second liner conductive layer below the first liner conductive layer; and
a third liner conductive layer over the first liner conductive layer,
wherein first, second and third liner conductive layers are made of different materials from each other.

5. The semiconductor device of claim 4, wherein the first liner conductive layer is made of Co.

6. The semiconductor device of claim 5, wherein the second liner conductive layer includes one or more of TaN, Ta, Ti, TiN or TiW.

7. The semiconductor device of claim 6, wherein the third liner conductive layer includes Cu or a Cu alloy.

8. The semiconductor device of claim 7, wherein the main conductive layer includes Cu or a Cu alloy.

9. A semiconductor device, comprising:
a pad electrode formed in or on a first dielectric layer;
a second dielectric layer disposed over the first dielectric layer;
a redistribution layer having a via portion passing through the second dielectric layer and connected to the pad electrode and a wire portion disposed on an upper surface of the second dielectric layer;
a third dielectric layer disposed over the redistribution layer; and
a bump electrode connected to the redistribution layer through an opening formed in the third dielectric layer, wherein:
the redistribution layer includes a liner conductive layer, a main conductive layer disposed over the liner conductive layer, and a cover conductive layer, and
the main conductive layer is fully sealed by the cover conductive layer and the liner conductive layer.

10. The semiconductor device of claim 9, wherein the main conductive layer is not in contact with the second dielectric layer and the third dielectric layer.

11. The semiconductor device of claim 9, wherein a part of the cover conductive layer is disposed between the bump electrode and the main conductive layer.

12. The semiconductor device of claim 9, wherein a part of the main conductive layer is in contact with the bump electrode.

13. The semiconductor device of claim 9, wherein a center of the pad electrode is laterally shifted from a center of the bump electrode.

14. The semiconductor device of claim 9, wherein:
the liner conductive layer and the cover conductive layer are made of Co, and
the main conductive layer is made of Cu or a Cu alloy.

15. The semiconductor device of claim 9, further comprising a barrier layer below the liner layer.

16. The semiconductor device of claim 15, wherein the barrier layer includes one or more of TaN, Ta, Ti, TiN or TiW.

17. A semiconductor device, comprising:
a trench disposed in a first dielectric layer, the trench including a shallow wire portion and a deep via portion having a greater depth than the shallow wire portion;
one or more liner conductive layers disposed in the trench;
a main conductive layer disposed over the one or more liner conductive layers in the trench;
a cover conductive layer disposed over the main conductive layer; and
a second dielectric layer disposed over the cover layer and the first dielectric layer
wherein the main conductive layer is fully wrapped around by the cover conductive layer and one of the one or more liner conductive layers.

18. The semiconductor device of claim 17, wherein the cover conductive layer is not disposed on an upper surface of the first dielectric layer.

19. The semiconductor device of claim 17, wherein:
the one of the one or more liner conductive layers and the cover layer are made of a same metal material, and
the same metal material is one of Co, V, Ta, Ti, Mo, Ni, Y, Nb, Zr, Ru, Re, Rh, Pd or Ir.

20. The semiconductor device of claim 17, wherein the main conductive layer is not in contact with the first and second dielectric layers.

* * * * *